United States Patent
Cole et al.

(10) Patent No.: US 6,746,547 B2
(45) Date of Patent: Jun. 8, 2004

(54) METHODS AND COMPOSITIONS FOR OXIDE PRODUCTION ON COPPER

(75) Inventors: Joseph Cole, Redwood City, CA (US); Rudolf P. Sedlak, Mountain View, CA (US)

(73) Assignee: RD Chemical Company, Mountain View, CA (US)

( * ) Notice: Subject to any disclaimer, the term of this patent is extended or adjusted under 35 U.S.C. 154(b) by 9 days.

(21) Appl. No.: 10/093,097

(22) Filed: Mar. 5, 2002

(65) Prior Publication Data

US 2003/0168128 A1 Sep. 11, 2003

(51) Int. Cl.⁷ ............................................. C23C 22/00
(52) U.S. Cl. .................... 148/243; 148/273; 148/282; 148/284; 427/97; 427/98; 427/126.3
(58) Field of Search .................... 148/293, 273, 148/282, 284; 427/97, 98, 126.3

(56) References Cited

U.S. PATENT DOCUMENTS

| | | | |
|---|---|---|---|
| 3,532,568 A | 10/1970 | Kovell et al. | |
| 3,556,883 A | 1/1971 | Naito et al. | |
| 3,650,959 A | * 3/1972 | Shipley, Jr. et al. | 252/79.1 |
| 3,756,957 A | 9/1973 | Shiga | |
| 3,773,577 A | 11/1973 | Shibasaki | |
| 3,880,685 A | 4/1975 | Rehm et al. | |
| 3,948,703 A | 4/1976 | Kushibe | |
| 4,051,057 A | 9/1977 | Ericson et al. | |
| 4,409,037 A | 10/1983 | Landau | |
| 4,528,245 A | * 7/1985 | Jobbins | 428/457 |
| 4,604,160 A | * 8/1986 | Murakami et al. | 216/18 |
| 4,642,161 A | 2/1987 | Akahoshi et al. | |
| 4,755,444 A | 7/1988 | Karakida et al. | |
| 4,844,981 A | 7/1989 | Landau | |
| 4,902,551 A | 2/1990 | Nakaso et al. | |
| 4,956,035 A | 9/1990 | Sedlak | |
| 4,981,560 A | 1/1991 | Kajihara et al. | |
| 4,997,516 A | 3/1991 | Adler | |
| 4,997,722 A | 3/1991 | Adler | |
| 5,037,482 A | 8/1991 | Kukanskis et al. | |
| 5,289,630 A | 3/1994 | Ferrier et al. | |
| 5,328,561 A | 7/1994 | Letize et al. | |
| 5,800,859 A | 9/1998 | Price et al. | |
| 5,807,493 A | 9/1998 | Mak et al. | |
| 5,855,805 A | 1/1999 | Arabinick | |
| 5,869,130 A | 2/1999 | Ferrier | |
| 5,885,476 A | 3/1999 | Hong et al. | |
| 5,965,036 A | 10/1999 | Maki et al. | |
| 6,020,029 A | 2/2000 | Ferrier et al. | |
| 6,074,803 A | 6/2000 | McGrath et al. | |
| 6,120,639 A | 9/2000 | Redline et al. | |
| 6,146,701 A | 11/2000 | Ferrier | |
| 6,162,503 A | 12/2000 | Ferrier | |
| 6,284,309 B1 | 9/2001 | Bishop et al. | |
| 6,294,220 B1 | 9/2001 | McGrath et al. | |

\* cited by examiner

*Primary Examiner*—Andrew L. Oltmans
(74) *Attorney, Agent, or Firm*—Carol L. Francis; Bozicevic, Field & Francis LLP

(57) ABSTRACT

The invention features and methods and compositions for oxide production on a Copper substrate, e.g., a Copper or Copper alloy substrate, to provide for improved adhesion of Copper substrate to polymeric material, e.g., such as used in manufacture of printed circuit boards. The oxide-producing compositions of the invention, which may be either acidic or ammoniacal, comprise 1) a source of $Cu^{++}$ (Cupric) ions; 2) a source of a primary electrolyte that is non-interactive with Copper ions; 3) a Cuprous ligand, e.g., a halide ion, preferably chloride, which also serves as a secondary electrolyte; and 4) an optional organic. Acidic oxide-producing compositions comprise a strong acid as the primary electrolyte. The primary electrolyte of ammoniacal oxide-producing compositions is a non-interactive, ammonium salt of acid, which provides a highly soluble Cupric ammonium salt. The secondary electrolyte of the oxide-producing compositions is selected so as to be compatible with the primary electrolyte.

84 Claims, No Drawings

METHODS AND COMPOSITIONS FOR OXIDE PRODUCTION ON COPPER

FIELD OF THE INVENTION

The invention relates to methods and compositions for treatment of Copper surfaces, particularly as used in the production of multilayered printed circuit boards.

BACKGROUND OF THE INVENTION

Printed circuit boards (PCBs) have long been used in the fabrication of electronic components. Printed circuits traditionally provide a support for discrete components, while providing most of the electrical interconnections between components. Today, the printed circuit board can have active electrical functionality, specifically it can have built-in capacitance. For example, innerlayers for multilayer PCBs are produced by first patterning a Copper foil-clad dielectric substrate material with resist in the negative image of the desired circuitry pattern, (e.g., the photoresist is retained on the surface by exposure to light to form a circuitry pattern), and then etching away the exposed, extraneous Copper. The resist is then removed, leaving behind the desired Copper circuitry pattern.

A multilayer circuitry is created by assembling circuitry innerlayers (having a desired circuitry pattern on one (single-sided) or both (double-sided) sides) with one or more partially-cured dielectric substrate material layers (referred to as "pre-preg" layers) between the circuitry innerlayers. The final multilayer product has alternating circuitry innerlayers and cured pre-preg layers. The layers are then laminated together under pressure and heat (which cures the prepreg) to form an integral composite board having several layer of circuitry embedded within to cure the partially cured pre-preg layer(s) and provide for bonding of the circuitry layers to the pre-preg layers. The cured multilayer product is then drilled to provide through holes, which are then plated to provide for conductive interconnection between the circuitry layers. Circuitry patterns are also typically applied to the outermost facing layers of the multilayer product.

Preparation of the innerlayer materials—particularly the Copper layers—is critical to production of the PCB. The smooth Copper surface is not conducive to strong adhesion to other materials, such as a subsequent layer of polymeric material (such as the pre-preg). If the Copper metal of the circuitry innerlayers is not treated, the Copper layer and the cured pre-preg layers (or other non-conductive coatings) are susceptible to delamination in subsequent processing or use This renders the multilayer board non-functional. Thus the industry has focused upon methods to improve adhesion and PCB quality.

A traditional method for improving the adhesive bond between the circuitry layer and the pre-preg layer focuses upon oxidizing the metal surface prior to assembly with the pre-preg layers. One approach has been to grow a crystalline CuO layer ("black oxide" layer) on the top of the Copper surface. The crystalline CuO layer provides for better interaction with the pre-preg layer due to the presence of hook-shaped structures of crystalline CuO, which provide a hook-like function in interacting with the pre-preg layer.

Early attempts in providing an oxidized metal surface involved the use of "black oxide" adhesion promoters, which provides some improvement in the adhesive bond between the circuitry innerlayers and the dielectric substrate layers in the final multilayer circuit as compared to the adhesive bond formed in the absence of oxidation of the metal surface. Later variations on this approach included production of a black oxide coating on the Copper surface, followed by treatment of the black oxide deposit with 15% sulfuric acid to produce a "red oxide" to serve as the adhesion promoter (see, e.g., Osborne, "An Alternate Route To Red Oxide For Inner Layers", PC Fab. August, 1984).

Later work involved direct formation of red or brown oxide adhesion promoter on the metal surface, with varying degrees of improvement in the adhesive bond (see, e.g., U.S. Pat. Nos. 4,409,037 and 4,844,981, describing oxides formed from relatively high chlorite/relatively low caustic Copper oxidizing compositions, and producing substantially improved results in circuitry inner layer adhesion). The principal difference between these different colors of oxide is the amount, or thickness, of the oxide layer. Within the industry, a black oxide usually means greater than 0.5 mg of CuO per square centimeter, a brown oxide means 0.2–0.5 mg/square centimeter, and a red oxide means less than 0.2 mg/square centimeter. Unexpectedly, the lighter the oxide weight, the better the bond strength.

However, the crystalline CuO "hook" structures are prone to handling damage. Furthermore, metallizing of through-holes in subsequent production steps involves the use of acidic compositions which can dissolve the Copper oxide layer on the coating on the circuitry innerlayer portions exposed at or near the through hole. This localized dissolution of the Copper oxide, which causes formation of a pink ring or halo around the through-hole (due to the pink color of the underlying, and now exposed, Copper metal), can in turn lead to localized delamination.

In response, the industry has attempted many variations to avoid this localized delamination. One suggested approach has been to make the CuO coating thicker, thus avoiding dissolution of the layer in subsequent processing simply by virtue of the sheer volume of Copper oxide present. This approach has proven counter-productive since the thicker oxide coating is inherently less effective as an adhesion promoter per se.

An alternative approach involves post-treatment of the oxidized Copper surface to stabilize or protect the Copper oxide layer prior to assembly of circuitry innerlayers and pre-preg layers into a multilayer composite. For example, U.S. Pat. No. 4,775,444 discloses a process in which the Copper surfaces of the circuitry innerlayers are first provided with a Copper oxide coating and then contacted with an aqueous chromic acid solution before the circuitry innerlayers are incorporated into the multilayer assembly.

In some processes, the Copper oxide layer is reduced to metallic Copper using particular reducing agents and conditions (see, e.g., U.S. Pat. Nos. 4,642,161; 4,902,551; and 4,981,560). The final multilayer assembly employing such circuitry innerlayers does not evidence pink ring formation since there is no Copper oxide present for localized dissolution, and localized exposure of underlying Copper, in subsequent through-hole processing. However, this process complicates the problem in that the metallic Copper is now present in at least two distinct phases: (1) Copper-from-reduction-of-Copper oxide over (2) Copper of the Copper foil. These two phases are prone to separation or delamination along the boundary between the two phases.

A similar approach is described in U.S. Pat. Nos. 4,997, 722 and 4,997,516, which describe formation of a Copper oxide coating on the Copper surfaces of circuitry innerlayers, followed by treatment with a specialized reducing solution to reduce the Copper oxide to metallic Copper. Certain portions of the Copper oxide apparently may not be reduced all the way to metallic Copper (being reduced instead to hydrous Cuprous oxide or Cuprous hydroxide), and those species are thereafter dissolved away in a non-oxidizing acid which does not attack or dissolve the portions already reduced to metallic Copper. However, these processes also result in production of two distinct phases of Copper—(1) Copper-from-reduction-of-Copper oxide over (2) Copper of the Copper foil, and thus increases the likelihood of separation and delamination along the phase boundary.

U.S. Pat. No. 5,289,630 describes a process involving treatment of the Copper surface to provide an adhesion-promoting layer of Copper oxide, followed by a controlled dissolution and removal of a substantial amount of the Copper oxide.

U.S. Pat. No. 5,869,130 describes a process for improving the adhesion of polymeric materials to a metal surface by treating the metal surface with an adhesion-promoting composition having adhesion enhancing ions, where treating is accomplished by deposition of the adhesion-enhancing ions by immersion (or galvanic) displacement plating on to the surface, to blacken the surface. The adhesion promoting composition is composed of (a) an oxidizer; (b) an acid; (c) a corrosion inhibitor; (d) a source of halide ions; and (e) optionally, a water soluble polymer. U.S. Pat. No. 6,146,701 describes a similar method in which the adhesion promoting composition further comprises a source of adhesion enhancing ions (selected from molybdates, tungstates, tantalates, niobates, vanadates, and mixtures thereof). U.S. Pat. No. 6,162,503 describes a variation on this latter adhesion-promoting method, and involves treatment of the metal surface with a composition comprising an oxidizer, an acid, a corrosion inhibitor, a benzoatriazole with an electron withdrawing group in the 1-poistion (which is stronger than a hydrogen group) and, optionally, a source of adhesion enhancing ions (similar to those of U.S. Pat. No. 6,146,701). U.S. Pat. No. 6,120,639 to Redline, et al. of MacDermid, Inc. describes a process for improving the adhesion of a copper surface to a resinous layer, the process comprising contacting the copper layer with an adhesion promoting composition comprising a reducing agent and a metal selected from the group consisting of gold, silver, palladium, ruthenium, rhodium, zinc, nickel, cobalt, iron and alloys of the foregoing metals.

U.S. Pat. No. 6,020,029 describes a processing for improving adhesion by contacting the metal surface with an acidic peroxide adhesion promoting composition, followed by contacting the metal surface with an alkaline solution.

U.S. Pat. No. 6,294,220 to McGrath, et al. of Alpha Metals describes a post-treatment method for copper on printed circuit boards, which involves forming a cupric-based organometallic conversion coating on a copper surface of a printed circuit board, and then converting the cupric-based organometallic conversion coating to a cuprous-based organometallic conversion coating, which is said to improve copper to dielectric bond integrity.

U.S. Pat. No. 5,800,859 (to Alpha Metals) describes a process for treating a Copper or Copper alloy surface to promote adhesion thereto, by contacting the metal surface with an adhesion promotion composition having 0.1 to 20% by weight hydrogen peroxide, an inorganic acid, an organic corrosion inhibitor and a surfactant so as to form a microroughened conversion-coated surface.

Still other method focus upon providing a "microroughened" surface. An example of such a process is described in U.S. Pat. No. 6,284,309 (to Alpha Metals), which process uses a composition containing (a) an acid, (b) an oxidizing agent, (c) a Copper complexing agent selected from the group consisting of thioureas and imidazole-thiones, and (d) a Copper complex, wherein the Copper complex is present in an amount which precipitates when applied to the Copper or Copper alloy substrate.

Although a variety of compositions are available in the art, there remains much room for improvement. For example, there is a continuing desire to reduce the costs of the chemicals used in these processes. For example, many conventional methods for oxide production require polymeric additives or surfactants to improve adhesion of the Copper. These additives can greatly increase the cost of the production method. In addition, the waste generated from the use of many conventional microetches and oxide production processes contains Copper ions, which is in and of itself a serious environmental concern. While the amount of Copper in the waste solutions of conventional processes make the waste solutions environmental hazards, it is not enough to justify the expense of recovery of the Copper.

The present invention provides a method for providing acceptable—if not improved—adhesive bonds between the Copper metal and organic layers, using comparatively inexpensive compositions. Furthermore, the waste materials generated using the methods and compositions of the invention have a concentration of Copper that is great enough to make the recovery economically attractive.

SUMMARY OF THE INVENTION

The invention features and methods and compositions for oxide production on a Copper substrate, e.g., a Copper or Copper alloy substrate. The oxide production using the compositions of the invention provide for improved adhesion to polymeric material, such as FR-4, polyimide, Teflon, pre-preg, and other laminate materials used in the manufacture of printed circuit boards, and may be either acidic or ammoniacal. The oxide-producing compositions of the invention comprise 1) a source of $Cu^{++}$ (Cupric) ions; 2) a source of a primary electrolyte that is non-interactive with the Copper ions (either with Cuprous or Cupric ions), particularly with Cuprous ions; 3) a Cuprous ligand, such as halide ions, preferably chloride, which also serves as a secondary electrolyte; and 4) an optional organic. Acidic oxide-producing compositions comprise a strong acid, such as sulfuric or nitric acid, as the primary electrolyte. Ammoniacal oxide-producing compositions comprise a non-interactive, ammonium salt of acid which will provide a highly soluble Cupric ammonium salt, preferably ammonium sulfate or ammonium nitrate, as the primary electrolyte. The secondary electrolyte of the acidic and ammoniacal oxide-producing compositions is selected so as to be compatible with the primary electrolyte.

In one aspect the invention features methods for oxide production on a Copper substrate, the method comprising contacting a surface of a Copper substrate with an oxide-producing composition. The oxide-producing compositions\comprises: a) a source of $Cu^{++}$ (Cupric) ions; b) a source of a primary electrolyte that is non-interactive with either Cuprous ion or Cupric ion; and c) a source of a Cuprous ligand. Contacting of the metal surface with the oxide-producing composition is under conditions and for a time sufficient for oxide production on the surface of the Copper substrate, so that production of oxide on the Copper substrate produces a treated Copper surface that, when bonded to an organic substrate, produces an adhesive bond of enhanced strength relative to an untreated Copper substrate surface.

In specific embodiments, the oxide producing composition further comprises an organic compound selected from the group consisting of a straight chain alkyne alcohol and a dicarboxylic acid.

In other specific embodiments, the Cuprous ligand is a halide ion. In related embodiments, the Cuprous ligand is chloride or bromide. In further related embodiments, the source of Cuprous ligand is Cupric Chloride.

In further specific embodiments, the oxide-producing composition is an acidic oxide-producing composition, and the source of the primary electrolyte is a strong acid. In related embodiments, the strong acid is sulfuric acid or nitric acid. In other related embodiments of the acidic oxide-producing composition, the source of Cupric ions is Copper sulfate.

In another embodiment, the oxide-producing composition is an ammoniacal oxide-producing composition, and the source of the primary electrolyte is an ammonium salt of an acid. In related embodiments, the ammonium salt is ammonium sulfate or ammonium nitrate.

In another aspect, the invention features a method for oxide production on a Copper substrate, the method comprising contacting a surface of a Copper substrate with an acidic oxide-producing composition. The acidic oxide-producing composition comprises a) a source of $Cu^{++}$ (Cupric) ions; b) a strong acid that is non-interactive with Cuprous or with Cupric ion; and c) a source of halide ions. Contacting of the Copper substrate and the acidic oxide-producing composition is under conditions and for a time sufficient for oxide production on the surface of the Copper substrate, such that production of oxide on the Copper substrate produces a treated Copper surface that, when bonded to an organic substrate, produces an adhesive bond of enhanced strength relative to an untreated Copper substrate surface.

In specific embodiments, the acidic oxide producing composition further comprises an organic compound selected from the group consisting of a straight chain alkyne alcohol and a dicarboxylic acid.

In further specific embodiments, the halide ion is chloride or bromide. In another embodiment, the halide ion is present at about 1,000 ppm to 10,000 ppm. In other embodiments, the source of halide ions is Cupric Chloride.

In still another embodiment, the strong acid is sulfuric acid. In a related embodiment, the source of Cupric ions is Copper Sulfate. In another embodiment, the strong acid is nitric acid. In a related embodiment, the source of Cupric ions is Copper Nitrate.

In another aspect the invention features a method for oxide production on a Copper substrate, the method comprising contacting a surface of a Copper substrate with an ammoniacal oxide-producing composition. The ammoniacal oxide-producing composition comprises a) a source of $Cu^{++}$ (Cupric) ions; b) an ammonium salt of an acid that provides a primary electrolyte that is non-interactive with Cuprous or with Cupric ion; and c) a source of halide ions. Contacting of the Copper substrate and the ammoniacal oxide-producing composition is under conditions and for a time sufficient for oxide production on the surface of the Copper substrate such that production of oxide on the Copper substrate produces a treated Copper surface that, when bonded to an organic substrate, produces an adhesive bond of enhanced strength relative to an untreated Copper substrate surface.

In specific embodiments, the ammonium salt is ammonium sulfate. In related embodiments, the source of Cupric ions is Copper Sulfate.

In other specific embodiments, the ammonium salt is ammonium nitrate. In related embodiments, the source of Cupric ions is Copper Nitrate.

In another embodiment, the ammoniacal oxide producing composition further comprises an organic compound selected from the group consisting of a straight chain alkyne alcohol and a dicarboxylic acid.

In another embodiment, the halide ion is chloride or bromide. In one related embodiment, the source of halide ions is Cupric Chloride. In still another embodiment, the halide ion is present at about 1,000 ppm to 10,000 ppm.

In yet another aspect the invention features a method for adhering a polymeric resin to a surface of a Copper substrate, the process comprising contacting a surface of a Copper substrate with an oxide-producing composition under conditions and for a time sufficient for oxide production on the surface of the Copper substrate to produce a treated Copper substrate; and adhering a polymeric material to the treated surface of the Copper substrate. The oxide-producing compositions comprises a) a source of $Cu^{++}$ (Cupric) ions; b) a source of a primary electrolyte that is non-interactive with Cuprous ion or with Cupric ion; and c) a source of a Cuprous ligand. The source of primary electrolyte is selected from the group consisting of a strong acid and an ammonium salt of an acid.

In one embodiment, the oxide producing composition further comprises an organic compound selected from the group consisting of a straight chain alkyne alcohol and a dicarboxylic acid.

In other embodiments, the Cuprous ligand is a halide ion, which in turn may be bromide or chloride. The source of Cuprous ligand can be Cupric chloride or Copper Bromide.

In another embodiment, the source of primary electrolyte is a strong acid and the strong acid is sulfuric acid.

In another embodiment, the source of primary electrolyte is ammonium sulfate.

In related embodiments, the source of Cupric ions is copper sulfate.

In another embodiment, the polymeric material is a prepreg.

In yet another aspect the invention features a composition comprising an oxide-producing composition, which oxide-producing composition comprises a) a source of $Cu^{++}$ (Cupric) ions; b) a source of a primary electrolyte that is non-interactive with Cuprous or with Cupric ion; and c) a source of a Cuprous ligand; wherein each of a), b) and c) are present in an amount such that contacting the oxide-producing composition with a Copper substrate in the presence of atmospheric oxygen results in production of Copper oxide on the Copper substrate.

In one embodiment, the composition further comprises a Copper substrate, which Copper substrate is exposed to atmospheric oxygen.

In another embodiment the oxide producing composition further comprises an organic compound selected from the group consisting of a straight chain alkyne alcohol and a dicarboxylic acid.

In still another embodiment, the Cuprous ligand is a halide ion. In related embodiments, the halide ion is chloride or bromide. In another related embodiment, the source of Cuprous ligand is Cupric Chloride.

In another embodiment, the oxide-producing composition is an acidic oxide-producing composition, and the source of the primary electrolyte is a strong acid. In related embodiments, the strong acid is sulfuric acid, and the source of Cupric ions can be Copper sulfate. In another related embodiment, the strong acid is nitric acid, and the source of Cupric ions can be Copper nitrate.

In another embodiment, the oxide-producing composition is an ammoniacal oxide-producing composition, and the source of the primary electrolyte is an ammonium salt of an acid. In related embodiments, the ammonium salt is ammonium sulfate, and the source of Cupric ions can be Copper sulfate. In another related embodiment, the ammonium salt is ammonium nitrate, and the source of Cupric ions can be Copper nitrate.

In one embodiment, the source of Cuprous ligand is chloride, which chloride is present at from about 1,000 ppm to 10,000 ppm.

In another aspect, the invention features a method of replenishing an oxide producing chemical system, the method comprising replenishing an oxide production bath by addition of a replenishing composition, wherein the oxide production bath comprises an oxide-producing composition comprising a) a source of $Cu^{++}$ (Cupric) ions; b) a source of a primary electrolyte that is non-interactive with Cuprous or Cupric ion; and c) a source of a Cuprous ligand; wherein each of a), b) and c) are present in the oxide-producing composition in an amount such that contacting the oxide-producing composition with a Copper substrate in the presence of atmospheric oxygen results in production of Copper oxide on the Copper substrate, and wherein the replenishing composition comprises b) and c), and where addition of the replenishing composition to the oxide product bath restores the bath so as to have concentrations of Cupric ions, primary electrolyte, and Cuprous ligand similar to that of a bath prior to use in oxide production.

In one embodiment, the oxide-producing composition further comprises an organic compound selected from the group consisting of a straight chain alkyne alcohol and a dicarboxylic acid.

In another embodiment, the Cuprous ligand is a halide ion. In related embodiments, the halide ion is chloride or bromide. In other related embodiments, the source of Cuprous ligand is Cupric Chloride.

In one embodiment, the oxide-producing composition is an acidic oxide-producing composition, and the source of the primary electrolyte is a strong acid selected from the group consisting of sulfuric acid and nitric acid. In related embodiments, strong acid is sulfuric acid and the source of Cupric ions is Copper sulfate. In other related embodiments, the strong acid is nitric acid and the source of Cupric ions is Copper nitrate.

In another embodiment, the oxide-producing composition is an ammoniacal oxide-producing composition, and the source of the primary electrolyte is an ammonium salt of an acid selected from the group consisting of ammonium sulfate and ammonium nitrate. In related embodiments, the ammonium salt is ammonium sulfate and the source of Cupric ions is Copper sulfate.

In one embodiment, the source of Cuprous ligand is chloride, which chloride is present at from about 1,000 ppm to 10,000 ppm.

In specific embodiments of the invention, the oxide-producing composition is an acidic oxide-producing composition, and comprises 1) from 10 grams/liter to saturation of Cupper present as a salt of an inactive acid, 2) from 0.001 to 2.0 N of the above mentioned inactive acid; 3) from 0.0001 to 2.0 N of a Cuprous ligand, which is preferably a halide; and, optionally, 4) an organic additive whose presence facilitates a more uniform bond.

In specific embodiments of the invention, the oxide-producing composition is an ammoniacal oxide-producing composition, and comprises: 1) from 10 grams/liter to saturation of Copper present as the Cupric Ammonia Salt of an inactive acid; 2) an amount of ammonium hydroxide sufficient to adjust the pH to greater than 7, and not greater than 10.5; 3) from 0.0001N to 2.0 N of a Cuprous ligand, which is preferably a halide; and, optionally, 4) an organic additive which facilitates a more uniform bond.

A primary object of the invention is to provide a metal surface having enhanced abilities to form an adhesive bond with another substrate, particularly an organic substrate.

One advantage of the invention is that the baths for oxide production have increased capacity, due to their ability to tolerate higher levels of Copper in solution than conventional baths. The sumps can be run to just below or at the saturation point of Copper without adversely affecting the oxide production processes In contrast, to conventional Hydrogen Peroxide based compositions for oxide production, the higher the levels of dissolved Copper in process of the invention, the faster, and thus more economically beneficial, the process. Whereas the Hydrogen Peroxide based systems are pushed to perform while maintaining high Copper loading in solution, the technology of the invention works more effectively, the higher the Copper loading, to the point of saturation.

Another advantage is the amount of Copper present in the waste materials generated from the processes using the oxide-producing compositions of the invention is great enough to make Copper recovery from the waste economically viable. This, in turn, promotes metal recovery rather than dilution and disposal. Reducing disposal of the waste in turn reduces the serious environmental risks associated with conventional methods.

Still another advantage of the methods and compositions of the invention is that oxide production is performed in a single step, thus streamlining, for example, the PCB production processes.

Yet another advantage of the invention is that the oxide production compositions are composed of inexpensive components, and use atmospheric Oxygen as the oxidant, thus reducing costs of the process still more.

Still another advantage is that the oxide-producing compositions and methods of the invention are readily adaptable to both acidic- and ammoniacal-based processes. That is, the invention provides both acidic and ammoniacal compositions useful in oxide production according to the invention. Thus increasing the choices of substrate dielectric material.

Other objects and advantages of the invention will be readily apparent to the ordinarily skilled artisan upon reading the present specification.

DETAILED DESCRIPTION OF THE INVENTION

Before the present methods and compositions are described, it is to be understood that this invention is not limited to particular steps or components described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "and", and "the" include plural referents unless the context clearly dictates otherwise. Thus, for example, reference to "a Copper surface" includes a plurality of such surfaces and reference to "the Copper ion" includes reference to one or more Copper ions and equivalents thereof known to those skilled in the art, and so forth. Furthermore, it should be noted that while the specification makes reference to a Copper surface, this is not meant to be limiting as the invention can also be in connection with treatment of Copper-containing surfaces such as Copper alloy surfaces.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Overview

The invention provides is based on the discovery of compositions suitable for oxide production on a Copper substrate, which compositions better tolerate higher concentrations of Copper ions in the bath. Furthermore, oxide production is accomplished in a single step. A better understanding of the invention can be facilitated by a review of the conventional processes of Copper surface preparation prior to the innerlayer lamination process.

In the present invention, oxide production involves dissolution of Copper from the surface of a Copper substrate, which can proceed as follows:

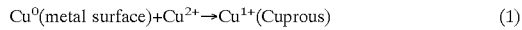

$$Cu^0(\text{metal surface}) + Cu^{2+} \rightarrow Cu^{1+}(\text{Cuprous}) \quad (1)$$

Oxide production according to the invention further involves oxidation of the Cuprous to produce the tarnish (oxide layer):

$$Cu^{1+} + O_2 \rightarrow CuO \quad (2)$$

The oxide-producing composition of the invention slows down the process of Copper dissolution that is associated with, for example, a conventional etchant, to dissolve Copper from the Copper surface at a rate of about 0.00001 to 0.0001 inches per minute, a rate which is about one-fourth that of the current oxide technology.

The oxide-producing compositions of the invention may be either acidic or ammoniacal. In each embodiment, the oxide-producing compositions of the invention comprise:

1) air (atmospheric oxygen) is used as the oxidant for the Copper ions,
2) a primary electrolyte, where the primary electrolyte is non-interactive with Copper ions (e.g., non-interactive with either Cuprous or with Cupric ions, with sulfate ($SO_4^{2-}$) and nitrate ($NO_3^-$) being preferred primary electrolytes), and
3) a Cuprous ligand as a secondary electrolyte, preferably a halide ion (such as Chloride).

In the acidic embodiment, the primary electrolyte is a strong acid; in the ammoniacal embodiment, the primary electrolyte is provided by an ammonium salt of an acid).

In both the acidic and ammoniacal embodiments, the primary electrolyte is "non-interactive" in that it does not interact with the Cuprous or Cupric ion to form a complex or other molecular entity, such as a precipitate, that interferes with reactions (1) or (2) above.

The Cuprous ligand can be, for example, thiourea or a halide ion. In a preferred embodiment, the Cuprous ligand is a halide ion, e.g., chloride, bromide, and the like, with chloride being particularly preferred.

The rate of Copper dissolution from the Copper surface is proportional to the amount of Cuprous ligand present in the composition, e.g., the amount of halide ion (e.g., Chloride) present in the composition.

Acidic oxide-producing compositions of the invention comprise 1) a source of $Cu^{++}$ ions, preferably Copper sulfate; 2) a strong, non-interactive acid as the primary electrolyte, such as sulfuric acid; 3) a source of halide ions, preferably chloride or bromide; and 4) an optional organic.

Ammoniacal oxide-producing compositions of the invention comprise: 1) source of $Cu^{++}$ ions, preferably Copper sulfate; 2) ammonium sulfate as the primary electrolyte; 3) a source of halide ions; and 4) an optional organic.

Treatment of a Copper surface using the compositions of the invention provides for improved bonding with polymeric materials, with significantly increased adhesion values (peel strength) as compared to a non-treated metal surface.

Each aspect of the invention will now be described in more detail.

Oxide-Producing Composition

The term "oxide-producing composition" as used herein is meant to refer to a composition that promotes dissolution of Copper metal from a Copper substrate and production of a layer of oxidized Copper on the Copper substrate.

In the course of dissolution of Copper from the Copper substrate, the oxide-producing composition and methods of the invention result in removal of about 5 microinches, usually about 10 microinches, more usually about 15 microinches, generally about 16 microinches of Copper from the treated surface, using air as the oxidant. If the user prefers, for unobvious reasons, more metal to be removed, this may be accomplished by increasing the Cuprous ligand concentration.

Without being held to theory, the rate at which the oxide-producing composition dissolves Copper from the surface is proportional to the amount of Cuprous ligand present, and can further be adjusted by other variables such as time of exposure of the substrate to the composition. Thus the Copper dissolution rate can be controlled by varying the concentration of halide ion present in the composition. In addition, the oxide-producing compositions do not require any surfactant or polymeric compound, and thus can be formulated so as to contain no detectable amount of such compounds.

The oxide-producing composition can be either an acidic oxide-producing composition or an ammoniacal oxide-producing composition. Each of these is described below.

Acidic Oxide-Producing Composition

In this embodiment of the oxide-producing composition, Acidic oxide-producing compositions of the invention comprise 1) a source of $Cu^{++}$ (Cupric) ions, preferably Copper sulfate; 2) a strong acid that is non-interactive with Copper ions (Cuprous or Cupric ions) and acts as a primary electrolyte (with $SO_4^{2-}$ and nitrate ($NO_3^-$) being preferred primary electrolytes); 3) a Cuprous ligand as a secondary electrolyte, preferably a source of halide ions (such as Chloride); and 4) an optional organic.

The source of Cupric ions generally provides for a concentration of Cupric ions in the composition up to saturation. The speed of metal dissolution, and thus oxide formation is also proportional to the concentration of the dissolved Copper, and thus concentrations below 10 grams per liter of Copper would be impractically slow. A preferred source of Cupric ions is Copper Sulfate.

The strong acid of the oxide-producing composition is a non-interactive acid, which acts as a primary source of electrolytes, and which does not interact with Copper ions, e.g., does not form a Cuprous or Cupric complex. Preferred strong, non-interactive acids include sulfuric acid and nitric acid. Sulfuric acid is particularly preferred. Other exemplary strong acids include, but are not necessarily limited to, Methane Sulfonic Acid, Perchloric and Acid. Preferably, the acid provides for protons on the order of about 0.05 N to 2 N $H^+$, with about 0.2N $H^+$ being preferred.

The Cuprous ligand may be provided by any suitable compound. As noted above, the Cuprous ligand serves as a secondary electrolyte, and further serves to control the rate of dissolution of Copper from the Copper substrate. Exemplary Cuprous ligands includes, but are not necessarily limited to, thiourea and halide ions. A preferred Cuprous ligand is a halide ion. The source of halide ions may be any suitable compound which provides halide ions when present in the acidic oxide-producing composition of the invention, particularly when present in the bath. Preferably, the source of halide ions is a metal salt (e.g., Cupric chloride) or halide bearing mineral acids (e.g., hydrochloric acid or hydrobromic acid). Exemplary preferred halide ions are chloride and bromide.

The Cuprous ligand concentration is selected so as give an optimum process speed. The Cuprous ligand serves as a receptor for the Cuprous ion, and without it the process would slow dramatically as the only marginally soluble Cuprous ion reached saturation levels. Preferably the Cuprous ligand concentration is at least about 100 ppm (w/w) 0.003 moles per liter to 10,000 ppm, 0.3 moles per liter, with about 1,000 ppm 0.03 moles per liter halide ion being preferred.

The pH of the ammoniacal oxide-producing composition can be adjusted using an appropriate acid or base (e.g., where the halide ion is chloride, HCl, Sulfuric, or the acid of the primary ammonium salt in the system, and the like can be added to lower the pH, while CuO, NaOH, KOH, and preferably ammonium hydroxide, and the like can be added to increase the pH). The system can be buffered to maintain the desired pH using a auxiliary buffer, although the ammonia/ammonium ion functions as a buffer at the preferred pH range. In general, the pH is selected so as to insure that the Cuprous and Cupric salts of the buffer are soluble.

The acidic oxide-producing composition can also optionally include an organic compound such as a straight chain, alkyne alcohol (e.g., butyne diol, propargyl alcohol, and the like), or dicarboxylic acid (e.g., glutaric acid, succinic acid, adipic acid, or any combination thereof (e.g., as in the blend found in BASF dicarboxylic acid)). The preferred organic will form insoluble, and preferably dark colored compounds with Copper. When present, the organic is generally provided at from about 0.01% w/w to about 5% w/w.

In one specific embodiment, the acidic oxide-producing composition comprises 1) from about 10 grams/liter to saturation of Cupper present as a salt of an inactive acid, 2) from about 0.001 to 2.0 N of the above mentioned non-interactive acid; 3) from about 0.0001 to 2.0 N of a Cuprous ligand, which is preferably a halide; and, optionally, 4) an organic additive whose presence gives a more uniform bond.

A processing temperature of about 65–70° F. (room temperature) may be used. The acidic oxide-producing composition is generally in contact with the Copper substrate for about 30 seconds to 5 minutes, usually for about 2 minutes when used at 65–70° F. Higher temperatures may be used, with proportionally shorter process times. Generally, the optimum contact time is reduced by 50% as the temperature increased by 20° F.

Ammoniacal Oxide-Producing Composition

Ammoniacal oxide-producing compositions of the invention comprise: 1) source of $Cu^{++}$ ions, preferably Copper sulfate; 2) a non-interactive, primary electrolyte (which does not interact with Cuprous or Cupric ions), preferably ammonium sulfate or ammonium nitrate; 3) a source of Cuprous ligand, preferably a halide ion; and 4) an optional organic.

The source of Cupric ions generally provides for a concentration of Cupric ions in the composition up to saturation, typically in a concentration greater than about 0.5 M. As in the acidic compositions, speed of the process is proportional to Cupric ion concentration, and thus composition with less than 0.2 M Cupric ion are impractically slow. Preferably, the source of Cupric ions is Copper sulfate.

The source of the primary electrolyte is an ammonium salt of an acid, preferably ammonium sulfate or ammonium nitrate, but may also be Ammonium Methane Sulfonate or Ammonium Perchlorate. The primary electrolyte (e.g., $SO_4^{2-}$ or $NO_3^-$ ions) is generally present in the composition from 0.1M to 2 M, and can be present up to saturation.

The pH of the composition is adjusted by addition of $NH_4^+OH$ to provide for a pH of from about pH 8 to about pH 10. A pH of about 8.3 has proven optimal to date.

The Cuprous ligand may be provided by any suitable compound. As noted above, the Cuprous ligand serves as a secondary electrolyte, and further serves to control the rate of dissolution of Copper from the Copper substrate. Exemplary Cuprous ligands include thiourea and halide ions. Halide ion is a preferred Cuprous ligand. The source of halide ions may be any compound which provides halide ions when present in the ammoniacal oxide-producing composition of the invention. Preferably, the source of halide ions is a metal salt (e.g., Cupric chloride). Exemplary preferred halide ions are chloride and bromide.

The Cuprous ligand concentration is selected so as to balance the concentration of Cuprous ligand and Cuprous ion to provide for an acceptable speed of the process without the metal precipitating out of solution. Preferably the Cuprous ligand concentration is at least about 100 ppm (0.003M) to 10,000 (0.3M) ppm, with about 1,000 ppm). (03M)halide ion being preferred.

The ammoniacal oxide-producing composition can also optionally include an organic compound such as a straight chain alkyne alcohol (e.g., butyne diol, propargyl alcohol, and the like), or dicarboxylic acid (e.g., glutaric acid, succinic acid, adipic acid, or any combination thereof (e.g., as in the blend found in BASF dicarboxylic acid)). When present, the organic is generally provided at from about 0.01% w/w to about 5% w/w.

In specific embodiments of the invention, the oxide-producing composition is an ammoniacal oxide-producing composition, and comprises: 1) from about 10 grams/liter to saturation of Copper present as the Cupric Ammonia Salt of an inactive acid; 2) an amount of ammonium hydroxide sufficient to adjust the pH to greater than about 7, and not greater than about 10.5; 3) from about 0.0001N to 2.0 N of a Cuprous ligand, which is preferably a halide; and, optionally, 4) an organic additive which maintains a more uniform bond.

A processing temperature of about 65–70° F. (room temperature) is generally preferred. The ammoniacal oxide-producing composition is generally in contact with the Copper substrate for about 30 seconds to 5 minutes, usually for about 2 minutes. Higher temperatures may be used, however ammonia is volatile, and temperature of over 130° F. are thus not practical. As with the acid versions, the optimum time is reduced as the temperature increases, again by 50% for each increase of 200° F.

Process Line

In one embodiment, the compositions and methods of the invention are incorporated into a process line for the production of a Copper substrate having bound polymeric material, as in, for example, printed circuit board (PCB) production. While the methods of the invention are particularly suited for use in manufacture of multilayer printed circuit boards, the methods are not limited to such, and can be applied to any manufacturing process where there is a need to provide for a bond between a Copper surface and an organic (e.g., polymeric) substrate.

In general, the process can involve: 1) cleaning the Copper surface; 2) producing of an oxide layer on the Copper surface; 3) drying the treated surface prior to assembly with the organic substrate; and 4) bonding the treated Copper substrate to a polymeric material (e.g., pre-preg) under heat and pressure. The process can further involve steps prior to, intermediate to, and/or subsequent to these steps.

Copper Surface

Metal surfaces that can be treated according to the invention include a Copper substrate, such as a Copper or Copper alloy substrate. Reference to "Copper" or "Copper surface" as used herein is not meant to be limiting to substrates and surfaces that contain only Copper, but instead is meant to encompass Copper-containing surfaces such as Copper alloy surfaces. "Copper substrate" is thus intended to encompass any Copper containing substrate suitable for treatment according to the invention.

Organic Substrates

Treated Copper surfaces produced according to the invention can be bonded to any suitable organic substrate, which substrates is generally a polymeric material. Exemplary organic substrates include, but are not necessarily limited to, pre-preg materials, imageable dielectrics, and the like. Exemplary organic substrates include, but are not necessarily limited to, brominated epoxy (known in the industry as FR-4) and polyimides, known also as "flex circuits", and polytetrafluoroethylenes (Teflon™).

The following provides a general description of the use of the oxide-producing compositions of the invention in steps of the PCB manufacturing process.

Cleaning

Where desired, the metal surface can first be cleaned using any conventional, compatible, effective cleaning composition. Exemplary cleaning compositions include, but are not necessarily limited to, etchants, microetchants, alkaline cleaners, preferably chelated using Citrates, Tartrates, Gluconates, EDTA, and its derivatives. Acid Cleaners of interest include those, containing, but not limited to, various mineral and/or organic acids, and optionally surfactants, and/or water soluble solvents. All these types of compositions are well known to those familiar with the art and practice of metal finishing.

The type of cleaner is generally chosen according to a wide variety of factors including, but not necessarily limited to the type of soil to be removed, and process condition (time, temperature) limitations. In general, The choice of type of cleaner is driven by the nature of the soils, and the cleaning process conditions.

Cleaning time may vary (e.g., from one (1) to five (5) minutes), depending upon, for example, the temperature of the cleaning solution, the tenacity of the soils, and the like. Where the metal substrate is on an exposed alkali-sensitive substrate, such as polyimide, the cleaner can be an acid, or a buffered alkaline cleaner.

Rinsing is generally accomplished using the "Cascade" technique, which is preferable particularly where water conservation is a concern. In general, this technique involves three connected rinse chambers, with fresh water only in the last chamber. The rinses in chamber two are pumped from the sump (the tank underneath) to rinse chamber 3, rinses in chamber 1 are pumped from the sump to chamber 2, so that, the water falling from rinses in chamber one, go to the drain, or waste treat. This system provides three rinses, with fresh water going to only one chamber. The rinse waters are "cascading" down the process line, and each rinse is cleaner than the one before it.

Oxide Production

The cleaned Copper surface can be treated to produce an oxide layer using either a conventional oxide-producing composition or an oxide-producing composition of the invention.

In general, where the oxide-producing composition of the invention is used, the metal surface is contacted with the oxide-producing composition for at least about 20–30 seconds, at least about 1–2 minutes, and may be up to about 5 minutes. Generally the metal surface is contact with the oxide-producing composition for about 2 minutes. The oxidizing step can be carried out at room temperature (about 65–70° F.), or higher. The time and temperature of the process are generally adjusted to give an optimum bond strength, at the minimum process time. In general, oxide production is carried out for a time and at a temperature sufficient to provide for an oxidized metal surface having the desired capabilities (e.g., enhanced ability to form an adhesive bond with an organic substrate) and an appearance that suits the current industry standards, which are an arbitrary dark brown to black color.

Typical pre-cleaners include Sodium or Potassium Persulfate water solutions in the 50–15 grams/liter range, and with 0.1–0.2N Sulfuric Acid added.

Spray application is generally preferred (e.g., compared to immersion) as this mode of application maximizes air contact with the metal surface.

Replenishing

The bath for the oxide-production step, which bath contains the oxide-producing composition, can be replenished to maintain the useful life of the bath by addition of a replenishing composition comprising (appropriately selected): 1) a source of the primary electrolyte; and 2) a source of the secondary electrolyte/Cuprous ligand (e.g., halide ion).

For example, when using an acidic oxide-producing composition comprising sulfate as the primary electrolyte and chloride as the secondary electrolyte, then an exemplary replenishing composition comprises $H_2SO_4$ and HCl. Where an acidic oxide-producing composition comprising sulfate as the primary electrolyte and a bromine as the secondary electrolyte, then an appropriate replenishing composition comprises $H_2SO_4$ and HBr. Similarly, when using an ammoniacal oxide-producing composition comprising the primary electrolyte sulfate and the second electrolyte chloride, then an appropriate replenishing composition comprises ammonium sulfate and HCl. When using an ammoniacal oxide-producing composition comprising the primary electrolyte nitrate and the second electrolyte chloride, then an appropriate replenishing composition comprises ammonium nitrate and ammonium chloride.

The concentration of the primary and secondary electrolytes in the replenishing composition can be selected so as to provide a desired concentrations of each of the electrolytes upon addition to the bath. In general, the replenisher is formulated to maintain all ingredients in the bath at levels that are within an acceptable range for function of the bath, preferably at a near constant level. Thus, for example, if an organic is present in the bath, the replenisher also includes the organic at the about the same concentration as in the use solution.

For example, where it is desired to maintain the bath such that the concentration of Copper ions is about 70 g/l, a replenishing composition comprising about 126.7 g/l sulfuric acid and, where an amount the desired Cuprous ligand sufficient to maintain the desired level of Cuprous ligand in the bath.

Ideally the replenisher is added when the Copper concentration approaches saturation, and may actually begin to precipitate the principal Cupric salt. This point can be determined by monitoring either the specific gravity of the use solution, or, in the case of the acid compositions of this invention, because the acidity of the solution is consumed as the Copper concentration builds, the Copper content may also be inferred by measuring and monitoring the acidity in the use solution.

Dry

The treated metal surface is then dried using any acceptable means.

Bonding to the Organic Substrate

The treated metal surface can then be bonded (e.g., through lamination) to an organic substrate according to conventional methods. Where the multilayered product is to be used in the production of a PCB, the multilayered product is processed according to conventional methods to provide the finished PCB.

Characteristics of the Layered Product

Metal surfaces treated according to the invention provide for a desirable adhesive bond (e.g., a peel strength at or above industry standards). The peel strength will vary with the type of organic it is bonded to, but the common industry standard is the poly brominated epoxy referred to as FR-4, and industry standard bond strengths are on the order of 4–6 pounds on a one inch wide strip. In general, the strength of the adhesive bond is at least about 10%, usually at least about 50%, more usually at least about 100%, still more generally at least about 150%, and can be at least about 200% or more improved relative to peel strength of an adhesive bond between an untreated metal surface and an organic substrate.

EXAMPLES

The following examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g. amounts, temperature, etc.) but some experimental errors and deviations should be accounted for. Unless indicated otherwise, parts are parts by weight, molecular weight is weight average molecular weight, and pressure is at or near atmospheric.

Example 1

Peel Strength of Adhesive Bond Between Pre-Preg and Copper Surface Treated with Acidic Oxide-Producing Compositions of the Invention The following provides examples of various oxide-producing compositions of the invention, and demonstrates strength if the bond formed between pre-preg and a ½-inch strip of Copper treated using these oxide-producing compositions. In each example, the Copper pre-cleaned in RD-68 (RD Chemical Co., Mountain View, Calif.) then treated with the indicated oxide-producing composition for 2 minutes at room temperature.

The treated Copper strip was then placed on FR-4 pre-preg, and heated to 350° F. for 30 to 60 minutes while applying pressure to the strip. The strip was then subjected to a standard peel strength test. The results are provided below. The components of the formulas are presented as percentage weight/weight, with the values in parentheses referring to the percentage weight/weight of the reagent.

| Formula | Peel Strength (g/½ inch) |
|---|---|
| 25% Copper sulfate<br>1% sulfuric acid (97%)<br>0.2% Cupric chloride<br>(1000 ppm Chloride) | 642.3 ± 449.6<br>(3 trials) |
| 22.25% Copper sulfate<br>1% sulfuric acid (97%)<br>2.0% Cupric chloride<br>(10,000 ppm chloride) | 335 ± 161.3<br>(4 trials) |
| 25% Copper sulfate<br>1% sulfuric acid (97%)<br>0.2% Cupric chloride<br>1% BASF dicarboxylic acid | 528 ± 327.9<br>(4 trials) |
| 25% Copper sulfate<br>1% sulfuric acid (97%)<br>2.0% Cupric chloride<br>1% BASF dicarboxylic acid | 351.7 ± 118.4<br>(4 trials) |
| 25% Copper sulfate<br>1% sulfuric acid (97%)<br>0.2% 50% HBr<br>(1000 ppm bromide) | 645.6 ± 430.2<br>(3 trials) |
| 25% Copper sulfate<br>2.0% 50% HBr<br>(10,000 ppm bromide) | 229 ± 106.7<br>(3 trials) |
| 25% Copper sulfate<br>0.2% Cupric chloride<br>(1000 ppm chloride)<br>1% sulfuric acid<br>2% butyne diol (35%) | 1839 ± 192<br>(4 trials) |
| 25% Copper sulfate<br>0.2% Cupric chloride<br>(1000 ppm chloride)<br>1% sulfuric acid (9 7%)<br>0.02% butyne diol (35%) | 470.1 ± 258<br>(4 trials) |
| 25% Copper sulfate<br>0.2% Cupric chloride<br>1% sulfuric acid (97%)<br>1% propargyl alcohol | 687.0 ± 545.0<br>(3 trials) |

Example 2

Peel Strength of Adhesive Bond Between Pre-Preg and Copper Surface Treated with Ammoniacal Oxide-Producing Compositions of the Invent The test described in Example 1 was repeated using the following ammoniacal oxide-producing composition:

12.3% ammonia solution (28–30%) (2.02M)
12% Copper sulfate (0.55M)
0.2% Cupric chloride (0.01M)
(1000 ppm chloride)
2% butynediol (35% solution)
16% ammonium sulfate (1.4M)
pH=9.51

The resulting bond strength was 2884±150 grams/1 inch wide strip.

Example 3

Peel Strength of Adhesive Bond Between Pre-Preg and Copper Surface Treated with Acidic Oxide-Producing Compositions of the Invent The test described in Example 1 was repeated using the ammoniacal oxide-producing composition of Example 2, but without the butyne diol organic. The resulting peel strength was 2700±800 grams per 1 inch wide strip. Interestingly, in this example, the peel strength varied with the location on the strip. The organic (in this comparison, butynediol) thus provides consistency to the peel strength over the surface of the Copper surface, but is not necessary to overall peel strength.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. A method for oxide production on a Copper substrate, the method comprising:
    contacting a surface of a Copper substrate with an acidic oxide-producing composition comprising:
        a) Copper sulfate as a source of $Cu^{++}$ (Cupric) ions;
        b) sulfuric acid as a source of a primary electrolyte that is non-interactive with either of Cuprous or Cupric ion; and
        c) a source of a Cuprous ligand;
    said contacting being under conditions and for a time sufficient for oxide production on the surface of the Copper substrate;
    wherein production of oxide on the Copper substrate produces a treated Copper surface that, when bonded to an organic substrate, produces an adhesive bond of enhanced strength relative to an untreated Copper substrate surface.

2. The method of claim 1, wherein the oxide producing composition further comprises an organic compound chosen from a straight chain alkyne alcohol and a dicarboxylic acid.

3. The method of claim 1, wherein the Cuprous ligand is a halide ion.

4. The method of claim 3, wherein the halide ion is chloride or bromide.

5. The method of claim 3, wherein the source of Cuprous ligand is Cupric Chloride.

6. A method for oxide production on a Copper substrate, the method comprising:
    contacting a surface of a Copper substrate with an ammoniacal oxide-producing composition comprising:
        a) a source of $Cu^{++}$ (Cupric) ions:
        b) ammonium nitrate as a source of a primary electrolyte that is non-interactive with either of Cuprous or Cupric ion; and
        c) a source of a Cuprous ligand;
    said contacting being under conditions and for a time sufficient for oxide production on the surface of the Copper substrate;
    wherein production of oxide on the Copper substrate produces a treated Copper surface that, when bonded to an organic substrate, produces an adhesive bond of enhanced strength relative to an untreated Copper substrate surface.

7. A method for oxide production on a Copper substrate, the method comprising:
    contacting a surface of a Copper substrate with an acidic oxide-producing composition comprising:
        a) Copper nitrate as a source of $Cu^{++}$ (Cupric) ions;
        b) nitric acid as a strong acid that is non-interactive with either of Cuprous or Cupric ion; and
        c) a source of halide ions;
    said contacting being under conditions and for a time sufficient for oxide production on the surface of the Copper substrate;
    wherein production of oxide on the Copper substrate produces a treated Copper surface that, when bonded to an organic substrate, produces an adhesive bond of enhanced strength relative to an untreated Copper substrate surface.

8. The method of claim 7, wherein the acidic oxide producing composition further comprises an organic compound chosen from a straight chain alkyne alcohol and a dicarboxylic acid.

9. The method of claim 7, wherein the halide ion is chloride or bromide.

10. The method of claim 7, wherein the source of halide ions is Cupric Chloride.

11. The method of claim 7, wherein the halide ion is present at about 1,000 ppm to 10,000 ppm.

12. A method for oxide production on a Copper substrate, the method comprising:
    contacting a surface of a Copper substrate with an ammoniacal oxide-producing composition comprising:
        a) a source of $Cu^{++}$ (Cupric) ions;
        b) ammonium nitrate as an ammonium salt of an acid that provides a primary electrolyte that is non-interactive with either of Cuprous or Cupric ion; and
        c) a source of halide ions;
    said contacting being under conditions and for a time sufficient for oxide production on the surface of the Copper substrate;
    wherein production of oxide on the Copper substrate produces a treated Copper surface that, when bonded to an organic substrate, produces an adhesive bond of enhanced strength relative to an untreated Copper substrate surface.

13. The method of claim 12, wherein the source of Cupric ions is Copper Nitrate.

14. The method of claim 12, wherein the ammoniacal oxide producing composition further comprises an organic compound chosen from a straight chain alkyne alcohol and a dicarboxylic acid.

15. The method of claim 12, wherein the halide ion is chloride or bromide.

16. The method of claim 12, wherein the source of halide ions is Cupric Chloride.

17. The method of claim 12, wherein the halide ion is present at about 1,000 ppm to 10,000 ppm.

18. A method for adhering a polymeric resin to a surface of a Copper substrate, said process comprising:

contacting a surface of a Copper substrate with an oxide-producing composition comprising:
   a) Cooper sulfate as a source of $Cu^{++}$ (Cupric) ions;
   b) sulfuric acid as a source of a primary electrolyte that is non-interactive with either of Cuprous or Cupric ion; and
   c) a source of a Cuprous ligand;
   wherein the source of primary electrolyte is chosen from a strong acid and an ammonium salt of an acid, and wherein said contacting is under conditions and for a time sufficient for oxide production on the surface of the Copper substrate; and adhering a polymeric material to the surface of the Copper substrate.

19. The method of claim 18, wherein the oxide producing composition further comprises an organic compound chosen from a straight chain alkyne alcohol and a dicarboxylic acid.

20. The method of claim 18, wherein the Cuprous ligand is a halide ion.

21. The method of claim 20, wherein the halide ion is bromide or chloride.

22. The method of claim 18, wherein the source of Cuprous ligand is Cupric chloride.

23. The method of claim 18, wherein the polymeric material is a pre-preg.

24. An acidic oxide-producing composition comprising:
   a) Copper sulfate as a source of $Cu^{++}$ (Cupric) ions;
   b) sulfuric acid a source of a primary electrolyte that is non-interactive with either of Cuprous or Cupric ion;
   c) a source of a Cuprous ligand; and
   d) an organic compound chosen from a straight chain alkyne alcohol and a dicarboxylic acid;
   wherein each of a), b), and c) and d) are present in an amount such that contacting the oxide-producing composition with a Copper substrate in the presence of atmospheric oxygen results in production of Copper oxide on the Copper substrate.

25. The composition of claim 24, wherein the composition further comprises a Copper substrate, which Copper substrate is exposed to atmospheric oxygen.

26. The composition of claim 24, wherein the Cuprous ligand is a halide ion.

27. The composition of claim 26, wherein the halide ion is chloride or bromide.

28. The composition of claim 26, wherein the source of Cuprous ligand is Cupric Chloride.

29. An acidic oxide-producing composition comprising:
   a) copper nitrate as a source of $Cu^{++}$ (Cupric) ions;
   b) nitric acid as a source of a primary electrolyte that is non-interactive with either of Cuprous or Cupric ion;
   c) a source of a Cuprous ligand; and
   d) an organic compound chosen from a straight chain alkyne alcohol and a dicarboxylic acid;
   wherein each of a), b), c) and d) are present in an amount such that contacting the oxide-producing composition with a Copper substrate in the presence of atmospheric oxygen results in production of Copper oxide on the Copper substrate.

30. The composition of claim 24, wherein the source of Cuprous ligand is chloride, which chloride is present at from about 1,000 ppm to 10,000 ppm.

31. The composition of claim 24, wherein the source of Cuprous ligand is chloride, which chloride is present at from about 1,000 ppm to 10,000 ppm.

32. The composition of claim 24, wherein:
   the source of the primary electrolyte is present at a concentration of from about 0.001 N to 2.0 N;
   the source of Cupric ions is at a concentration of from about 10 grams/liter to saturation; and
   the source of Cuprous ligand provides for from about 0.0001 N to 2.0 N Cuprous ligand.

33. A method of replenishing an oxide producing chemical system, the method comprising;
   replenishing an oxide production bath by addition of a replenishing composition, wherein the oxide production bath comprises an acidic oxide-producing composition comprising:
   a) a source of $Cu^{++}$ (Cupric) ions;
   b) a strong acid as a source of a primary electrolyte that is non-interactive with either of Cuprous or Cupric ion, wherein the strong acid is sulfuric acid when the source of Cupric ions is Copper sulfate and the strong acid is nitric acid when the source of Cupric ions is Copper nitrate;
   c) a source of a Cuprous ligand; and
   d) an organic compound chosen from a straight chain alkyne alcohol and a dicarboxylic acid;
   wherein each of a), b) and c) are present in the oxide-producing composition in an amount such that contacting the oxide-producing composition with a Copper substrate in the presence of atmospheric oxygen results in production of Copper oxide on the Copper substrate, and
   wherein the replenishing composition comprises b) and c), and
   where addition of the replenishing composition to the oxide product bath restores the bath so as to have concentrations of Cupric ions, primary electrolyate, and Cuprous ligand similar to that of a bath prior to use in oxide production.

34. The method of claim 33, wherein the Cuprous ligand is a halide ion.

35. The method of claim 34, wherein the halide ion is chloride or bromide.

36. The method of claim 33, wherein the source of Cuprous ligand is Cupric Chloride.

37. The method of claim 33, wherein the source of Cuprous ligand is chloride, which chloride is present at from about 1,000 ppm to 10,000 ppm.

38. A method for oxide production on a Copper substrate, the method comprising:
   contacting a surface of a Copper substrate with an ammoniacal oxide-producing composition comprising:
   a) Copper Nitrate as a source of $Cu^{++}$ (Cupric) ions;
   b) an ammonium salt of an acid that provides a primary electrolyte that is non-interactive with either of Cuprous or Cupric ion; and c) a source of halide ions;
said contacting being under conditions and for a time sufficient for oxide production on the surface of the Copper substrate;
wherein production of oxide on the Copper substrate produces a treated Copper surface that, when bonded to an organic substrate, produces an adhesive bond of enhanced strength relative to an untreated Copper substrate surface.

39. The method of claim 38, wherein the ammonium salt is ammonium nitrate.

40. The method of claim 38, wherein the ammoniacal oxide producing composition further comprises an organic compound chosen from a straight chain alkyne alcohol and a dicarboxylic acid.

41. The method of claim 38, wherein the halide ion is chloride or bromide.

42. The method of claim 38, wherein the source of halide ions is Cupric Chloride.

43. The method of claim 38, wherein the halide ion is present at about 1,000 ppm to 10,000 ppm.

44. The method of claim 1, wherein the oxide-producing composition contains no detectable amount of a polymeric compound.

45. A method for oxide production on a Copper substrate, the method comprising:
contacting a surface of a Copper substrate with an acidic oxide-producing composition comprising:
a) a source of $Cu^{++}$ (Cupric) ions:
b) a strong acid that is non-interactive with either of Cuprous or Cupric ion; and
c) a source of halide ions;
wherein the oxide-producing composition contains no detectable amount of a polymeric compound, said contacting being under conditions and for a time sufficient for oxide production on the surface of the Copper substrate;
wherein production of oxide on the Copper substrate produces a treated Copper surface that, when bonded to an organic substrate, produces an adhesive bond of enhanced strength relative to an untreated Copper substrate surface.

46. The method of claim 12, wherein the oxide-producing composition contains no detectable amount of a polymeric compound.

47. The method of claim 18, wherein the oxide-producing composition contains no detectable amount of a polymeric compound.

48. The composition of claim 24, wherein the oxide-producing composition contains no detectable amount of a polymeric compound.

49. The method of claim 45, wherein the acidic oxide producing composition further comprises an organic compound chosen from a straight chain alkyne alcohol and a dicarboxylic acid.

50. The method of claim 45, wherein the halide ion is chloride or bromide.

51. The method of claim 45, wherein the source of halide ions is Cupric Chloride.

52. The method of claim 45, wherein the halide ion is present at about 1,000 ppm to 10,000 ppm.

53. The method of claim 45, wherein the strong acid is sulfuric acid.

54. The method of claim 53, wherein the source of Cupric ions is Copper sulfate.

55. The method of claim 45, wherein the strong acid is nitric acid.

56. The method of claim 55, wherein the source of Cupric ions is Copper nitrate.

57. A method for adhering a polymeric resin to a surface of a Copper substrate, said process comprising:
contacting a surface of a Copper substrate with an acidic oxide-producing composition comprising:
a) a source of Cu++ (Cupric) ions;
b) a strong acid as a source of a primary electrolyte that is non-interactive with either of Cuprous or Cupric ion; and
c) a source of halide ions;
wherein the oxide-producing compositions contains no detectable amount of a polymeric compound, said contacting being under conditions and for a time sufficient for oxide production on the surface of the Copper substrate; and
adhering a polymeric material to the surface of the Copper substrate.

58. The method of claim 57, wherein the oxide producing composition further comprises an organic compound chosen from-a straight chain alkyne alcohol and a dicarboxylic acid.

59. The method of claim 57, wherein the halide ion is bromide or chloride.

60. The method of claim 57, wherein the source of halide ions is Cupric chloride.

61. The method of claim 57, wherein the strong acid and the strong acid is sulfuric acid.

62. The method of claim 61, wherein the source of Cupric ions is copper sulfate.

63. The method of claim 57, wherein the polymeric material is a pre-preg.

64. The method of claim 6, wherein the oxide producing composition further comprises an organic compound chosen from a straight chain alkyne alcohol and a dicarboxylic acid.

65. The method of claim 6, wherein the Cuprous ligand is a halide ion.

66. The method of claim 65, wherein the halide ion is chloride or bromide.

67. The method of claim 65, wherein the source of Cuprous ligand is Cupric Chloride.

68. The method of claim 6, wherein the oxide-producing composition contains no detectable amount of a polymeric compound.

69. The method of claim 6, wherein the source of Cupric ions is Copper nitrate.

70. The method of claim 7, wherein the oxide-producing composition contains no detectable amount of a polymeric compound.

71. The composition of claim 29, wherein the composition further comprises a Copper substrate, which Copper substrate is exposed to atmospheric oxygen.

72. The composition of claim 29, wherein the Cuprous ligand is a halide ion.

73. The composition of claim 72, wherein the halide ion is chloride or bromide.

74. The composition of claim 29, wherein the Cuprous ligand is Cupric Chloride.

75. The composition of claim 29, wherein the source of Cuprous ligand is chloride, which chloride is present at from about 1,000 ppm to 10,000 ppm.

76. The composition of claim 29, wherein:
the source of the primary electrolyte is present at a concentration of from about 0.001 N to 2.0 N;
the source of Cupric ions is at a concentration of from about 10 grams/liter to saturation; and
the source of Cuprous ligand provides for from about 0.0001 N to 2.0 N Cuprous ligand.

77. The method of claim 38, wherein the oxide-producing composition contains no detectable amount of a polymeric compound.

78. A method for adhering a polymeric resin to a surface of a Copper substrate, said process comprising:

contacting a surface of a Copper substrate with an ammoniacal oxide-producing composition comprising:
a) a source of $Cu^{++}$ (Cupric) ions;
b) ammonium nitrate as an ammonium salt of an acid that provides a primary electrolyte that is non-interactive with either of Cuprous or Cupric ion; and
c) a source of halide ions;

said contacting being under conditions and for a time sufficient for oxide production on the surface of the Copper substrate; and adhering a polymeric material to the surface of the Copper substrate.

79. The method of claim 78, wherein the oxide producing composition further comprises an organic compound chosen from-a straight chain alkyne alcohol and a dicarboxylic acid.

80. The method of claim 78, wherein the halide ion is bromide or chloride.

81. The method of claim 78, wherein the source of halide ions is Cupric chloride.

82. The method of claim 78, copper nitrate.

83. The method of claim 78, wherein the oxide-producing composition contains no detectable amount of a polymeric compound.

84. The method of claim 78, wherein the polymeric material is a pre-preg.

* * * * *

UNITED STATES PATENT AND TRADEMARK OFFICE
CERTIFICATE OF CORRECTION

PATENT NO. : 6,746,547 B2  
APPLICATION NO. : 10/093097  
DATED : June 8, 2004  
INVENTOR(S) : Joseph Cole et al.

Page 1 of 1

It is certified that error appears in the above-identified patent and that said Letters Patent is hereby corrected as shown below:

In the Specification:

- In column 3 line 34: Delete "poistion" and replace with --position--.
- In column 3 line 65: Insert --s-- after the word "method".
- In column 4 line 57: Delete "compositions\comprises" and replace with --composition comprises--.
- In column 9 line 21: Delete "and" and replace with --an--.
- In column 10 line 12: Delete ")".
- In column 12 line 59: Delete "(03M)halide" and replace with --(03M) halide--.

In The Claims:

- In column 20 line 8: Delete "claim 24" and replace with --claim 29--.
- In column 20 line 48: Delete "electrolyate" and replace with --electrolyte--
- In column 24 line 8: Insert --wherein the source of Cupric ion is-- before the phrase "copper nitrate".

Signed and Sealed this

Twenty-ninth Day of January, 2008

JON W. DUDAS  
*Director of the United States Patent and Trademark Office*